US008164887B2

(12) United States Patent
Cheng

(10) Patent No.: US 8,164,887 B2
(45) Date of Patent: Apr. 24, 2012

(54) KEYPAD MECHANISM FOR PORTABLE ELECTRONIC DEVICE AND METHOD FOR ASSEMBLING THE SAME

(75) Inventor: Chao-Yuan Cheng, Shindian (TW)

(73) Assignee: FIH (Hong Kong) Limited, Kowloon (HK)

( * ) Notice: Subject to any disclaimer, the term of this patent is extended or adjusted under 35 U.S.C. 154(b) by 86 days.

(21) Appl. No.: 12/784,590

(22) Filed: May 21, 2010

(65) Prior Publication Data

US 2011/0096478 A1 Apr. 28, 2011

(30) Foreign Application Priority Data

Oct. 28, 2009 (CN) .......................... 2009 1 0308975

(51) Int. Cl.
*H05K 5/00* (2006.01)
*H05K 7/00* (2006.01)
*H04M 1/00* (2006.01)
*G06F 3/02* (2006.01)

(52) U.S. Cl. ......... 361/679.09; 361/679.08; 361/679.11; 361/679.12; 361/679.13; 361/679.14; 361/679.15; 361/679.16; 361/679.17; 455/575.1; 455/575.3; 455/575.4; 455/575.8; 345/168; 345/169

(58) Field of Classification Search ............ 361/679.01, 361/679.02, 679.08, 679.09, 679.3, 679.55–679.59; 341/22–34; 345/168–178; 200/5 A, 5 D, 200/5 E, 302.1–302.3
See application file for complete search history.

(56) References Cited

U.S. PATENT DOCUMENTS

2006/0258325 A1 * 11/2006 Tsutaichi et al. ............ 455/350
2008/0105526 A1 * 5/2008 Wee et al. ..................... 200/5 A
2010/0147667 A1 * 6/2010 Cheng .......................... 200/5 A

* cited by examiner

*Primary Examiner* — Robert J Hoffberg
*Assistant Examiner* — Jerry Wu
(74) *Attorney, Agent, or Firm* — Altis Law Group, Inc.

(57) ABSTRACT

A portable electronic device includes a housing, a button assembly, two positioning elements, and a resisting plate. The housing defines a plurality of through holes. The button assembly includes buttons arranged in button rows. Each button row is received in one of the through hole. The positioning elements each are positioned at one side of the housing. The resisting plate and the positioning elements fix the button assembly to the housing.

10 Claims, 4 Drawing Sheets

KEYPAD MECHANISM FOR PORTABLE ELECTRONIC DEVICE AND METHOD FOR ASSEMBLING THE SAME

BACKGROUND

1. Technical Field

The present disclosure relates to keypad mechanisms and, particularly, to a keypad mechanism used in a portable electronic device and method for assembling the keypad mechanism.

2. Description of Related Art

With the development of wireless communication and information processing technologies, portable electronic devices, such as mobile telephones and personal digital assistants (PDAs), are now in widespread use. Keypad assemblies are used as input terminals.

Conventional keypad assemblies include a first housing, a button assembly, and a second housing. The button assembly is placed between the first housing and the second housing. The button assembly may become misaligned from a desired predetermined position during assembly.

Therefore, there is room for improvement within the art.

BRIEF DESCRIPTION OF THE DRAWINGS

Many aspects of the exemplary keypad mechanism can be better understood with reference to the following drawings. The components in the drawings are not necessarily drawn to scale, the emphasis instead being placed upon clearly illustrating the principles of the keypad mechanism for portable electronic device. Moreover, in the drawings, like reference numerals designate corresponding parts throughout the several views, in which.

DETAILED DESCRIPTION

The disclosure is illustrated by way of example and not by way of limitation in the figures of the accompanying drawings in which like references indicate similar elements. It should be noted that references to “an” or “one” embodiment in this disclosure are not necessarily to the same embodiment, and such references mean at least one.

Figure 1:
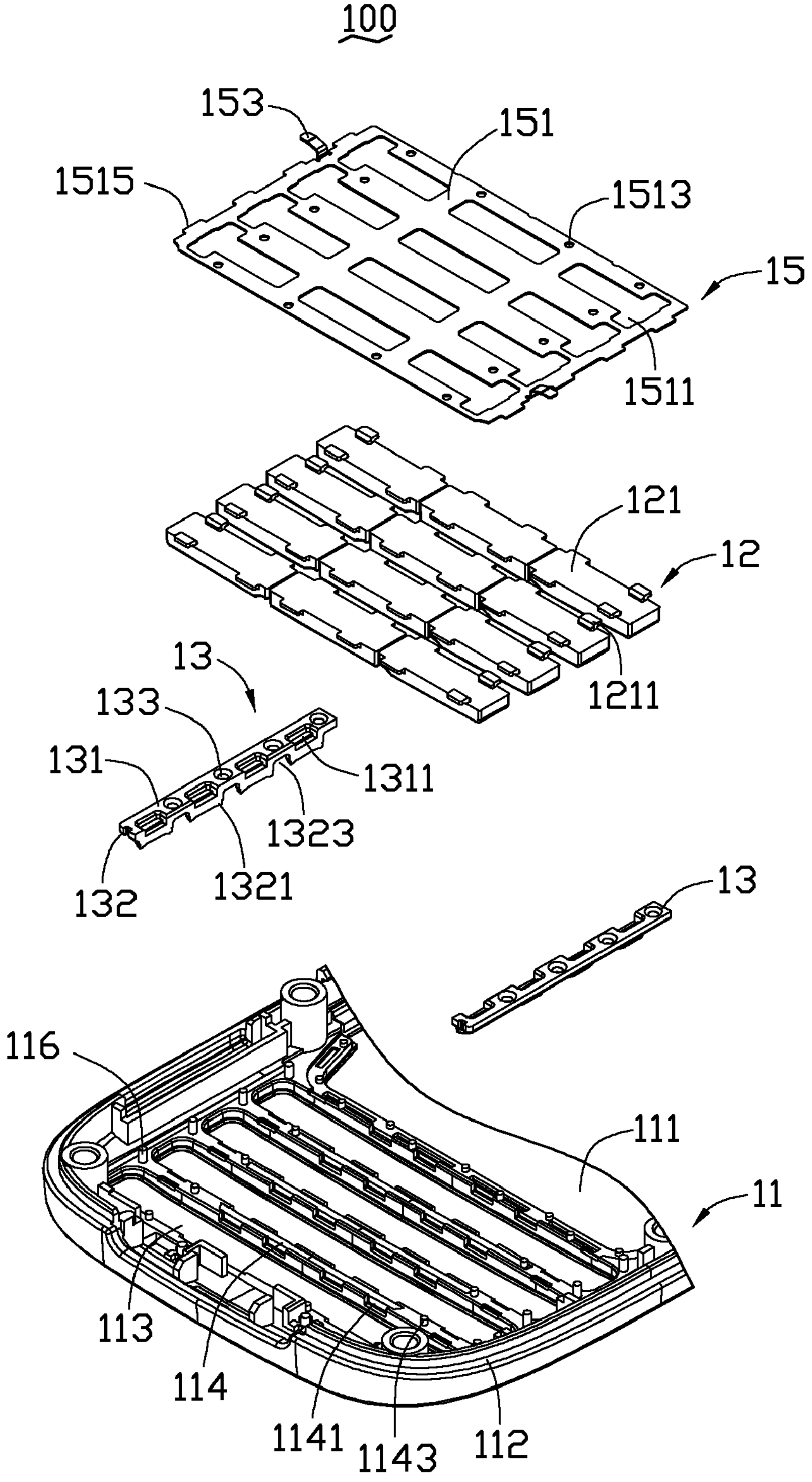
FIG. 1 is an exploded, isometric view of an exemplary embodiment of a keypad mechanism for a portable electronic device.

FIG. 1 is an exploded, isometric view of an exemplary embodiment of a keypad mechanism 100 for a portable electronic device, such as a cellular phone, a personal digital assistant (PDA), or a game player, where a keypad is desired. The keypad mechanism 100 includes a housing 11, a button assembly 12, two positioning elements 13, and a resisting plate 15. The button assembly 12 is fixed to the housing 11 by the positioning elements 13 and the resisting plate 15.

The housing 11 includes a plate portion 111 and a sidewall 112 projecting from a periphery of the plate portion 111. The plate portion 111 defines a plurality of spaced-apart through holes 113 and a plurality of ribs 114 are formed between adjacent through holes 113. The through holes 113 are parallel to each other in the exemplary embodiment. Each rib 114 defines a plurality of cutouts 1141. A plurality of posts 1143 substantially perpendicularly project from each rib 114. A plurality of positioning protrusions 116 substantially perpendicularly project from two sides of the plate portion 111 adjacent to the sidewall 112.

The button assembly 12 includes a plurality of buttons 121. The buttons 121 can be made of plastic or metal, and can have any shape for being received in the through holes 113. In the exemplary embodiment, three buttons 121 form a keypad row (not labeled). One keypad row is received in each through hole 113. A plurality of positioning blocks 1211 extend from two sides of each button 121 and are configured to be received in the cutouts 1141 of the housing 11.

Figure 2:
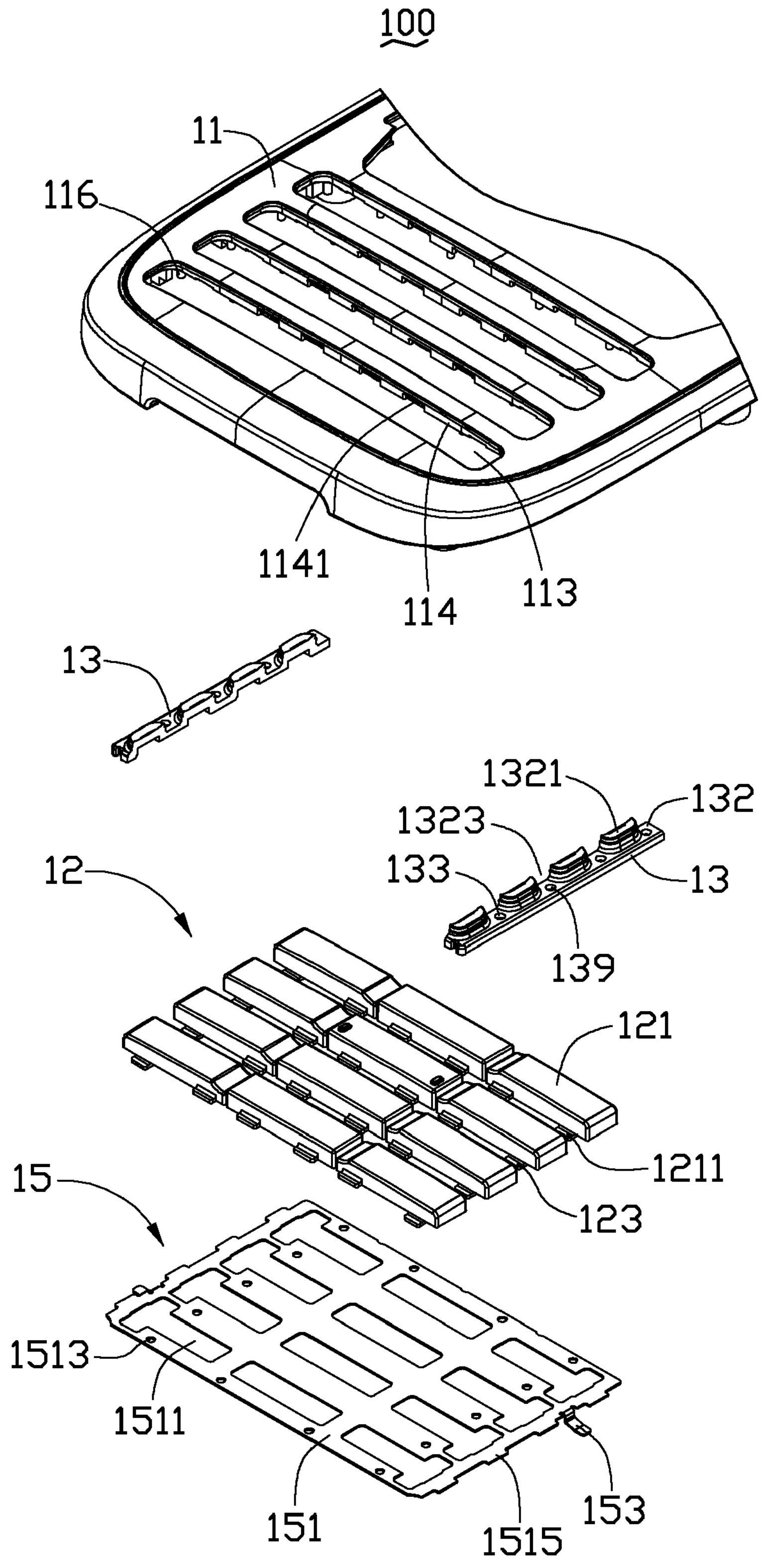
FIG. 2 is similar to FIG. 1, but viewed from another aspect.
Figure 3:
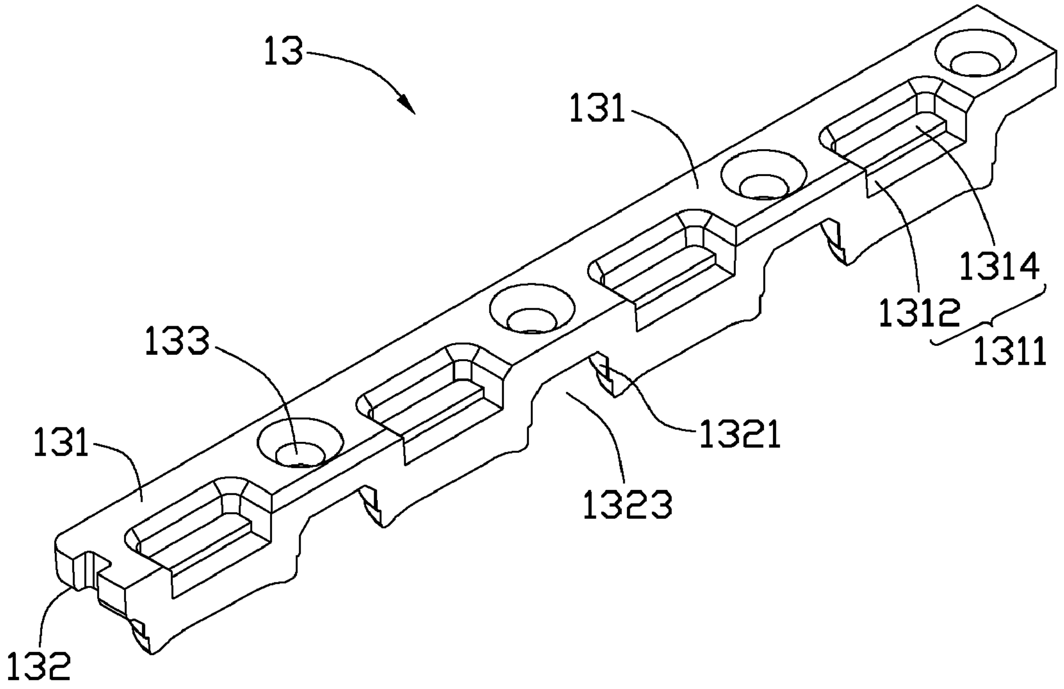
FIG. 3 is an enlarged view of a positioning element of FIG. 1.

Referring to FIGS. 2 and 3, each positioning element 13 is substantially a long beam, and includes a first surface 131 and an opposite second surface 132. The first surface 131 alternately defines a plurality of receiving holes 133 and a plurality of slots 1311. The receiving holes 133 communicate with the second surface 132 for receiving the positioning protrusions 116 of the housing 11. The slots 1311 communicate with one side of the positioning element 13. The bottom surface of each slot 1311 includes a first resisting surface 1312 and a raised second resisting surface 1314. A plurality of projections 1321 substantially perpendicularly project from the second surface 132 corresponding to the slots 1311. A receiving space 1323 is defined between two adjacent projections 1321, in which the buttons 121 are received.

The resisting plate 15 includes a support portion 151 and two tabs 153 extending from the edges of the support portion 151. The support portion 151 defines a plurality of positioning holes 1511 and a plurality of connecting holes 1513. The positioning holes 1511 are configured to receive the buttons 121 of the button assembly 12. The connecting holes 1513 are configured to receive the posts 1143 of the housing 11. A plurality of latching blocks 1515 extend from two sides of the support portion 151. The width of each latching block 1515 is approximately equal to the width of a corresponding slot 1311.

Figure 4:
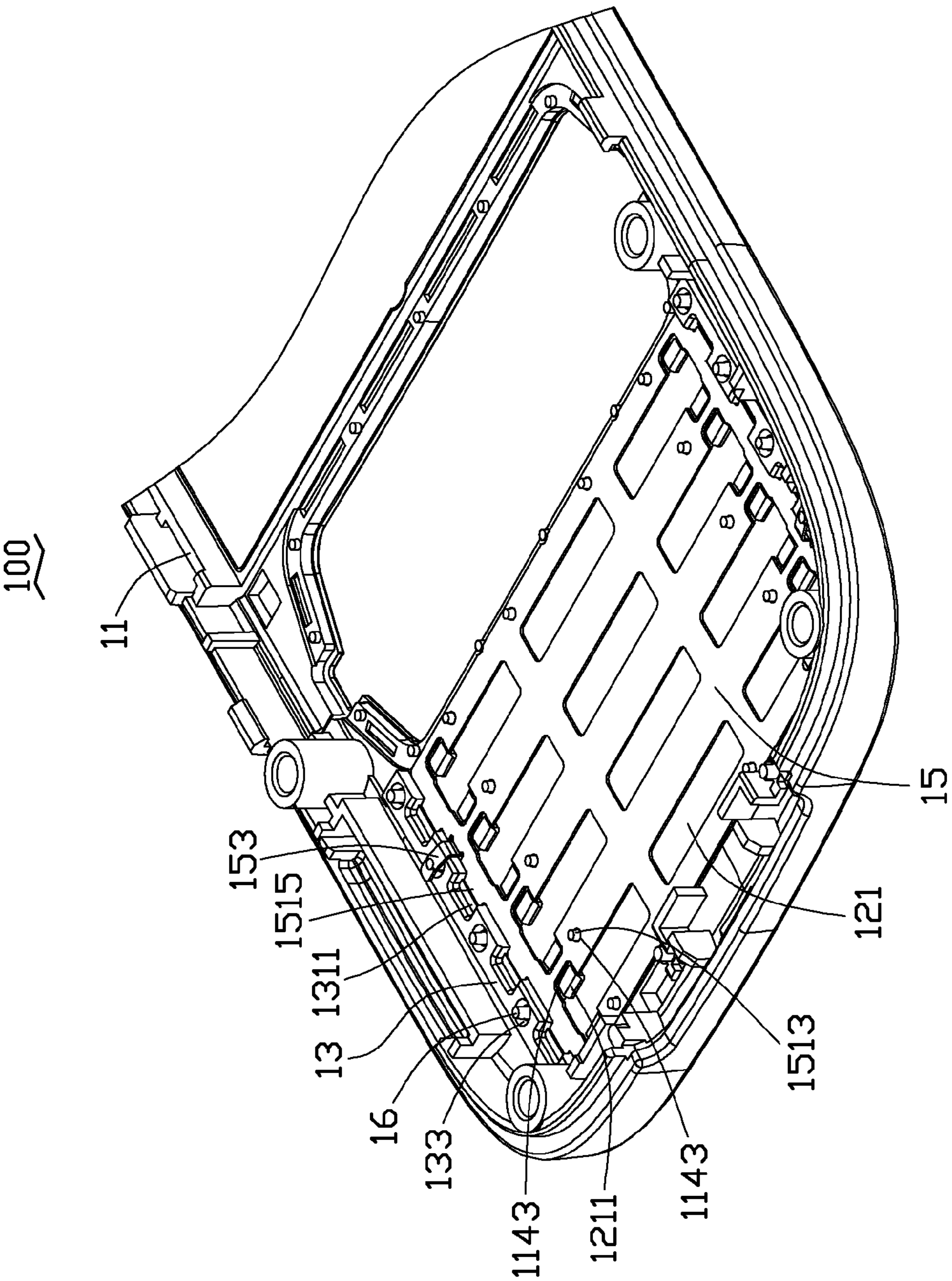
FIG. 4 is an assembled, isometric view of the keypad mechanism of FIG. 1.

Referring to FIG. 4, during assembly, the positioning elements 13 are attached to two sides of the housing 11. The positioning protrusions 116 are received in the corresponding receiving holes 133. The keypad rows of the button assembly 12 are respectively received in the through holes 113, and the positioning blocks 1211 are received in the corresponding cutouts 1141. Two ends of each keypad row of the buttons 121 are partially received in the receiving spaces 1323 of the positioning elements 13. Then, the positioning elements 13 are fixed to the housing 11 e.g., by heat-melting or welding. After that, the resisting plate 15 is placed on the button assembly 12 and the housing 11. The buttons 121 each are respectively exposed from a corresponding positioning hole 1511. The latching blocks 1515 are respectively received in the slots 1311, the tabs 153 resist the positioning elements 13. The posts 1413 extend into the connecting holes 1513. Therefore, the resisting element 15 and the positioning elements 13 together fix the button assembly 12 to the housing 11. Thus, the keypad mechanism 100 is assembled.

The above structure allows the keypad assembly 100 to be easily assembled. Additionally, the resisting element 15 and the positioning elements 13 are separate from the housing 11 so that the button assembly 12 and the housing 11 can be plated separately. Thus, the plating process is easier and the appearance of the button assembly 12 is greatly improved.

It is believed that the present embodiments and their advantages will be understood from the foregoing description, and it will be apparent that various changes may be made thereto without departing from the spirit and scope of the disclose or sacrificing all of its material advantages, the examples hereinbefore described merely being preferred or exemplary embodiments of the disclosure.

What is claimed is:

1. A keypad mechanism for portable electronic device comprising:

a housing defining a plurality of through holes and a plurality of ribs formed between adjacent through holes of the plurality of through holes, a plurality of posts projecting from each rib of the plurality of ribs;

a button assembly comprising a plurality of buttons arranged in button rows, each button row of the button rows being received in one of the plurality of through holes;

two separate positioning elements, each positioning element of the two separate positioning elements positioned at an opposing side of the housing, a plurality of projections projecting from each of the two separate positioning elements, a plurality of receiving spaces defined between the plurality of projections of the each of the two separate positioning elements, a first end of the each button row received in a respective one of the plurality of receiving spaces of a first one of the two separate positioning elements and a second end of the each button row received in a respective one of the plurality of receiving spaces of a second one of the two separate positioning elements; and a resisting plate defining a plurality of connecting holes, the plurality of posts received in the plurality of connecting holes to latch the resisting plate and the button assembly to the housing.

2. The keypad mechanism as claimed in claim 1, wherein a plurality of positioning protrusions project from the opposing sides of the housing, the each of the two separate positioning elements defines a plurality of receiving holes, in which the positioning protrusions are respectively received.

3. The keypad mechanism as claimed in claim 2, wherein a plurality of latching blocks extend from the resisting plate, the each of the two separate positioning elements define a plurality of slots, in which the latching blocks are received.

4. The keypad mechanism as claimed in claim 3, wherein the resisting plate comprises a support portion and two tabs projecting from the support portion, the latching blocks extend from the edges of the support portion, the tabs resist the two separate positioning elements, the support portion supports the button assembly.

5. The keypad mechanism as claimed in claim 3, wherein a plurality of positioning blocks extend from the buttons, each of the ribs defines a plurality of cutouts, in which the positioning blocks are received.

6. A portable electronic device comprising:

a housing defining a plurality of through holes and a plurality of ribs formed between adjacent through holes of the plurality of through holes, a plurality of posts projecting from each rib of the plurality of ribs;

a button assembly comprising a plurality of buttons arranged in button rows, each button row of the button rows being received in one of the plurality of through holes;

two separate positioning elements, each positioning element of the two separate positioning elements positioned at an opposing side of the housing, a plurality of projections projecting from the plurality of positioning elements, a plurality of receiving spaces defined between the plurality of projections, a first end of the each button row received in a respective one of the plurality of receiving spaces of a first one of the two separate positioning elements and a second end of the each button row received in a respective one of the plurality of receiving spaces of a second one of the two separate positioning elements; and a resisting plate defining a plurality of connecting holes, the plurality of posts received in the plurality of connecting holes to latch the button assembly and the two separate positioning elements to the housing.

7. The portable electronic device as claimed in claim 6, wherein a plurality of positioning protrusions project from the opposing sides of the housing, the each of the two separate positioning elements defines a plurality of receiving holes, in which the positioning protrusions are respectively received.

8. The portable electronic device as claimed in claim 7, wherein a plurality of latching blocks extend from the resisting plate, the each of the two separate positioning elements define a plurality of slots, in which the latching blocks are received.

9. The portable electronic device as claimed in claim 6, wherein the resisting plate comprises a support portion and two tabs projecting from the support portion, the latching blocks extend from the edges of the support portion, the tabs resist the two separate positioning elements.

10. The portable electronic device as claimed in claim 6, wherein a plurality of positioning blocks extend from the buttons, each of the ribs defines a plurality of cutouts, in which the positioning blocks are received.

* * * * *